United States Patent [19]

Holly et al.

[11] Patent Number: 4,801,555
[45] Date of Patent: Jan. 31, 1989

[54] DOUBLE-IMPLANT PROCESS FOR FORMING GRADED SOURCE/DRAIN REGIONS

[75] Inventors: Patrick J. Holly, Tempe, Ariz.; Louis C. Parrillo; Frank K. Baker, both of Austin, Tex.

[73] Assignee: Motorola, Inc., Schaumburg, Ill.

[21] Appl. No.: 3,176

[22] Filed: Jan. 14, 1987

[51] Int. Cl.$^4$ .............................................. H01L 00/00
[52] U.S. Cl. ...................................... 437/29; 437/44; 437/30; 437/958; 148/DIG. 82; 148/DIG. 83; 357/90; 357/91
[58] Field of Search ................. 29/571, 576 B, 577 C, 29/579; 357/90, 23.8, 91; 148/DIG. 82, DIG. 83; 437/44, 27, 30

[56] References Cited

U.S. PATENT DOCUMENTS

| | | | |
|---|---|---|---|
| 3,631,312 | 12/1971 | Moyle et al. | 357/23.8 |
| 3,798,079 | 3/1974 | Chu et al. | 357/90 |
| 4,049,478 | 9/1977 | Ghosh et al. | 357/90 |
| 4,172,260 | 10/1979 | Okabe et al. | 357/23.8 |
| 4,298,401 | 11/1981 | Nuez et al. | 148/1.5 |
| 4,420,872 | 12/1983 | Zaldivar | 437/41 |
| 4,560,582 | 12/1985 | Khikawa | 148/187 |
| 4,575,920 | 3/1986 | Tsumashima | 148/187 |
| 4,589,936 | 5/1986 | Komatsu | 148/188 |
| 4,590,663 | 5/1986 | Haken | 29/576 B |
| 4,637,124 | 1/1987 | Okuyama et al. | 29/571 |
| 4,656,492 | 4/1987 | Sunami et al. | 357/23.8 |

FOREIGN PATENT DOCUMENTS 0073623 9/1983 European Pat. Off. ............ 357/23.8

OTHER PUBLICATIONS

CRC Handbook of Chemistry and Physics, Table of Isotopes, Weast, Robert C. and Melvin J. Astle, eds. CRC Press, Inc., 1980-81, pp. B-258 to B-259.
Davies, "The Implanted Profiles of Boron, Phosphorus, and Arsenic in Silicon from Junction Depth Measurements", Solid State Electronics vol. 13, 1970, pp. 229-237 (G.B.).
Tsomg, "Fabrication of High Performance LODFETs with Oxide Sidewall-Spacer Technology" IEEE J. of Solid State Elcts, vol. SC17, No. 2 Apr. 82, pp. 220-226.

Primary Examiner—Brian E. Hearn
Assistant Examiner—M. Wilczewski
Attorney, Agent, or Firm—Jonathan P. Meyer

[57] ABSTRACT

A process for forming graded source/drain regions in semiconductor devices involves two ion implantation steps and an optional drive-in step. The first implantation is a low dose implant with high energy and/or low mass ions to form the deeper grading region. The second implant is a high does implant with low energy and/or high mass ions to form the shallower, lower resistivity source/drain region. Without the optional drive-in step, virtually no lateral grading takes place, resulting in little encroachment of the grading region under the gate. The use of a drive-in step between the two implant steps causes diffusion of the grading dopant, which increases the grading both laterally and vertically, resulting in better breakdown and capacitance characteristics, but increased encroachment under the gate. The present invention allows control over the lateral and vertical grading separately to optimize the trade-offs for a particular application.

3 Claims, 2 Drawing Sheets

DOUBLE-IMPLANT PROCESS FOR FORMING GRADED SOURCE/DRAIN REGIONS

FIELD OF THE INVENTION

The present invention relates, in general, to a double-implant process for forming graded source-drain regions in semiconductor devices. More particularly, the invention relates to a process for forming graded source-drain regions which provides greater flexibility and control over the relative degree of lateral and vertical grading than prior art double-implant processes.

BACKGROUND OF THE INVENTION

Two of the problems hindering the further shrinkage of metal-oxide-semiconductor (MOS) devices are decreased breakdown voltage and increased junction capacitance. In particular, shallow (<0.25 micron), low-resistivity P-type source/drain regions in N-type wells are subject to low junction breakdown voltage and high junction capacitance. These effects are particularly troublesome in the manufacture of high-density memories in which some devices may experience relatively high (~20V) voltages across the drain junction and in which junction capacitance is a major contributor to total bit-line capacitance.

A major focus of attention in the search for solutions to these problems is the use of "graded" source/drain regions. Such junctions are characterized by less abrupt changes in the doping profile across the junction and may be achieved with a large number of processes. In general, a graded junction has a higher breakdown voltage and a lower junction capacitance than a similar non-graded junction.

U.S. Pat. No. 4,298,401, issued Nov. 3, 1981 to Nuez et al., discloses a method of manufacturing a resistor in a semiconductor substrate using a double-implant process. The junction formed by the disclosed process is graded and exhibits a high breakdown voltage. The process involves a first implant of boron at a relatively low energy and a relatively high dose which determines the resistivity of the resistor and a second implant (the grading implant) of boron at a relatively high energy and a relatively low dose which determines the breakdown characteristics of the junction. These implants are followed by an anneal step to redistribute the dopant and to heal implant damage.

The Nuez et al. patent states that the disclosed process is suitable for forming graded source/drain junctions in the manufacture of active devices such as MOS transistors. However, the disclosed process has a number of drawbacks when so applied. For instance, Nuez et al. disclose no means of separately controlling the lateral and vertical grading of the junction. This control may be critical in small-geometry devices in which source/drain encroachment under the gate oxide must be carefully controlled. In addition, the relatively high energy of both the primary and grading implant steps disclosed by Nuez et al. are inappropriate for forming shallow source/drain junctions.

SUMMARY OF THE INVENTION

Accordingly, it is an object of the present invention to provide an improved double-implant process for forming graded source/drain regions.

A further object of the present invention is to provide separate control of lateral and vertical grading in a double-implant process for forming graded source/drain regions.

Still a further object of the present invention is to provide an improved double-implant process for forming shallow, graded source/drain regions.

These and other objects and advantages of the present invention are provided by a method of forming a graded source/drain region comprising the steps of performing a first ion implantation step at a relatively lower dose and using one of a relatively higher energy and a relatively less massive ion; optionally performing a grading drive-in thermal step to substantially equally vertically and laterally re-distribute the dopant deposited by the first ion implantation step; and performing a second ion implantation step at a relatively higher dose and using one of a relatively lower energy and a relatively more massive ion. The ratio of the masses of the ions used in the two implant steps and the ratio of the energies thereof determine the degree of vertical grading of the junction. The temperature and duration of the intervening thermal step determines the degree of lateral grading of the junction and the degree of encroachment under the gate oxide.

These and other objects and advantages of the present invention will be apparent to one skilled in the art from the detailed description below takn together with the drawings.

DETAILED DESCRIPTION OF THE INVENTION

Figure 1:
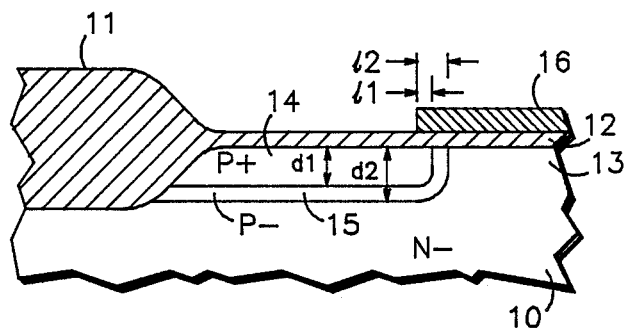
FIG. 1 is a cross-sectional view of a portion of a semiconductor device illustrating a source/drain junction according to the prior art.

FIG. 1 illustrates a source/drain region of an MOS device as might be manufactured following the disclosure of theNuez et al. patent referred to above. It is understood that, while the present invention is described with reference to MOS devices, the principles of the present invention also may be applied in related technologies such as SOI (silicon-on-insulator). The device illustrated in FIG. 1 could be manufactured by conventional self-aligned methods.

The device represented in FIG. 1 comprises a relatively high resistivity N-type well 10, a relatively thick field oxide region 11 overlying a portion of well 10, a relatively thin gate oxide 12 overlying a different portion of well 10, which portion includes channel region 13, a conductive gate 16 overlying gate oxide 12 over channel region 13, a relatively low resistivity P-type source/drain region 14 disposed immediately under the semiconductor surface between field oxide region 11 and gate 16, and a relatively high resistivity P-type grading region 15 surrounding source/drain region 14 and separating it from N-type well 10.

The structure of FIG. 1 could be manufactured by, for instance, using conventional local oxidation (LOCOS) process steps to form field oxide 11 and gate oxide 12, then forming and patterning a doped polysilicon layer to form gate 16, then following the double-implant process steps disclosed in the Nuez et al. patent. It is understood that the same or similar structures could be manufactured by many alternate techniques in addition to the one just described.

The structure resulting from the above-described steps is characterized by source/drain region 14 having a depth $d_1$ and grading region 15 having a depth $d_2$ greater than $d_1$. In addition, source/drain region 14 encroaches under gate 16 a distance $l_1$ and grading region 15 encroaches under gate 16 a distance $l_2$ which is greater than $l_1$. The difference between $d_2$ and $d_1$ and the difference between $l_2$ and $l_1$ are determined primarily by the difference in energy between the two implant steps and cannot be independently controlled to a significant degree.

The use of a graded junction structure as shown in FIG. 1 has three important effects on the characteristics of device. First, the fact that the more heavily doped P-type source/drain region is completely separated from the N-type well by the more lightly doped P-type grading region increases the breakdown voltage of the junction. Second, this same separation of the source/drain and well regions results in decreased junction capacitance. Finally, the encroachment of the grading region under the gate oxide decreases the effective gate length of the device.

In some applications, the prime design goal of a particular device may be junction capacitance. Or perhaps low junction capacitance combined with very small geometry, which implies little encroachment under the gate oxide, may be desired. The disclosure of Nuez et al. offers no opportunity to separately control these characteristics.

Figure 2:
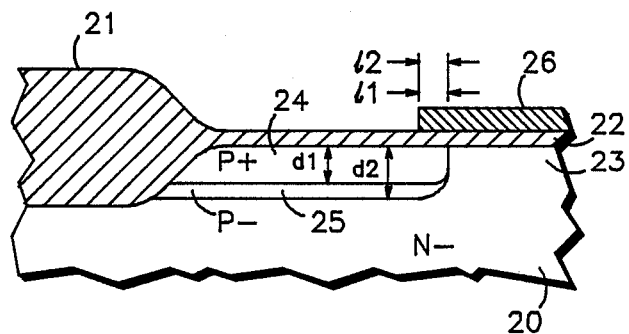
FIG. 2 is a cross-sectional view of a portion of a semiconductor device illustrating a source/drain junction according to one aspect of the present invention.

FIG. 2 illustrates a portion of an MOS device similar to that described above which has been manufactured according to one aspect of the present invention. The device comprises a relatively high resistivity N-type well 20, a relatively thick field oxide region 21 overlying a portion of well 20, a relatively thin gate oxide region 22 overlying a different portion of well 20, which portion includes channel region 23, a conductive gate 26 overlying gate oxide 22 over channel region 23, a relatively low resistivity P-type source/drain region 24 disposed immediately under the semiconductor surface between field oxide region 21 and gate 26 and a relatively high resistivity grading region 25 underlying source/drain region 24.

The device of FIG. 2 is characterized by source/drain region 24 having a depth $d_1$, grading region 25 having a depth $d_2$ greater than $d_1$, source/drain region 24 encroaching under gate 26 by a distance $l_1$ and grading region $l_2$ encroaching under gate 26 by a distance $l_2$ which is equal to $l_1$.

The device of FIG. 2 is well suited to high density memory applications and other applications in which very small geometry (i.e., short effective gate length) and junction capacitance are major design considerations. The fact that grading region 25 encroaches under gate 26 no more than does source/drain region 24 minimizes the shortened effective gate length penalty which is typical of graded source/drain processes. The fact that the majority of the area of the junction between source/drain region 24 and well 20 is graded contributes to a lower junction capacitance. That is, the vertically-oriented abrupt junction immediately underlying gate 26 has a relatively small area and, therefore, contributes a relatively small amount to the total junction capacitance. However, because this portion of the junction is abrupt, the breakdown voltage of the junction would be expected to be less than that of a fully graded junction.

The device of FIG. 2 may be manufactured by substantially the same steps as were disclosed above with only a variation in the double-implant steps. Once the field and gate oxides have been formed and the gate has been formed and patterned, a first ion implant is carried out to form grading region 25. As is discussed in greater detail below, the grading implant is a relatively low dose implant, thus forming the relatively high resistivity grading region, and is performed either at a relatively high energy or with a relatively low mass ion. The use of high energy or low mass ions ensures that the depth of the implanted region is sufficient. Next, without any intervening high temperature steps which would redistribute the grading implant, a second implant is carried out to form source/drain region 24. The second implant is carried out at a relatively high dose and either with low energy or high mass ions. The high dose provides the low resistivity of source/drain region 24 and the low energy or high mass provides the relatively more shallow depth of source/drain region 24.

The effects of ion energy and mass on ion implantation are well known. In general terms, the depth of an implanted region is proportional to the energy of the ions and is inversely proportional to the mass of the ions. Therefore, in choosing the desired depth of a particular implant, the energy and mass of the ions are the variables to be chosen. Examples provided below illustrate these choices.

The fact that no high temperature step, which would tend to redistribute the dopant species implanted in the first implant through diffusion, intervenes between the two implants, implies that the lateral grading of the junction is nearly non-existant. In fact, the edge of gate 26 tends to scatter the ions passing it. Since this is primarily a diffraction phenomenon, the degree of scattering tends to increase with an increase in energy. Therefore, if higher energy is chosen to place the grading implant at a greater depth than the source/drain implant, there will be some degree to which the encroachment of grading region 25 under gate 26 will exceed the encroachment of source/drain region 24. This may provide some very minor advantage in terms of breakdown voltage.

Figure 3:
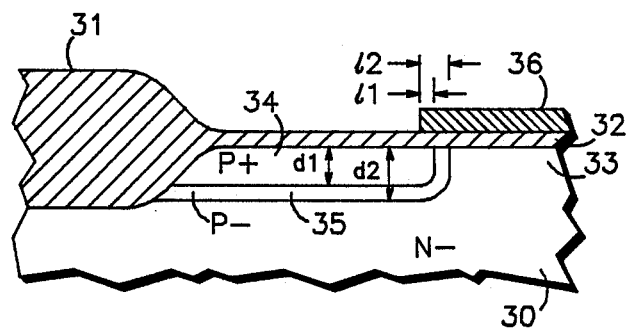
FIG. 3 is a cross-sectional view of a portion of a semiconductor device illustrating a source/drain junction according to another aspect of the present invention.

FIG. 3 illustrates a portion of an MOS device similar to that described above which has been manufactured according to another aspect of the present invention. The device comprises a relatively high resistivity N-type well 30, a relatively thick field oxide region 31 overlying a portion of well 30, a relatively thin gate oxide region 32 overlying a different portion of well 30, which portion includes channel region 33, a conductive gate 36 overlying gate oxide 32 over channel region 33, a relatively low resistivity P-type source/drain region 34 disposed immediately under the semiconductor surface between field oxide region 31 and gate 36 and a relatively high resistivity grading region 35 underlying source/drain region 34.

The device of FIG. 3 is characterized by source/drain region 34 having a depth $d_1$, grading region 35 having a depth $d_2$ greater than $d_1$, source/drain region 34 encroaching under gate 36 by a distance $l_1$ and grading region $l_2$ encroaching under gate 36 by a distance $l_2$ which is greater than $l_1$. The difference between this device and the prior art device of FIG. 1 is that the process of the present invention provides a degree of control over the relative degrees of vertical and lateral grading. The degree of vertical grading is represented by the difference between $d_2$ and $d_1$. The degree of lateral grading is represented by the difference between $l_2$ and $l_1$.

The device of FIG. 3 can be manufactured by a process identical to the process described above with reference to FIG. 2 with the addition of a high temperature step interposed between the two implant steps. Thus, diffusion of the grading implant dopant during this step, which is not experienced by the source/drain dopant, provides lateral grading. Of course, this intervening redistribution also provides some vertical grading, but the selection of higher energy or lower mass ions for the grading implant is still available for increasing the degree of vertical grading. In other words, the difference between $d_2$ and $d_1$ may be chosen to be greater than the difference between $l_2$ and $l_1$.

FIG.s 4 and 5 illustrate the steps of the process of the present invention in the context of a typical MOS process flow. The double-implant steps are shown immediately following the step of patterning the gate oxide. While this is fairly typical, various other alternatives are acceptable.

Figure 4:
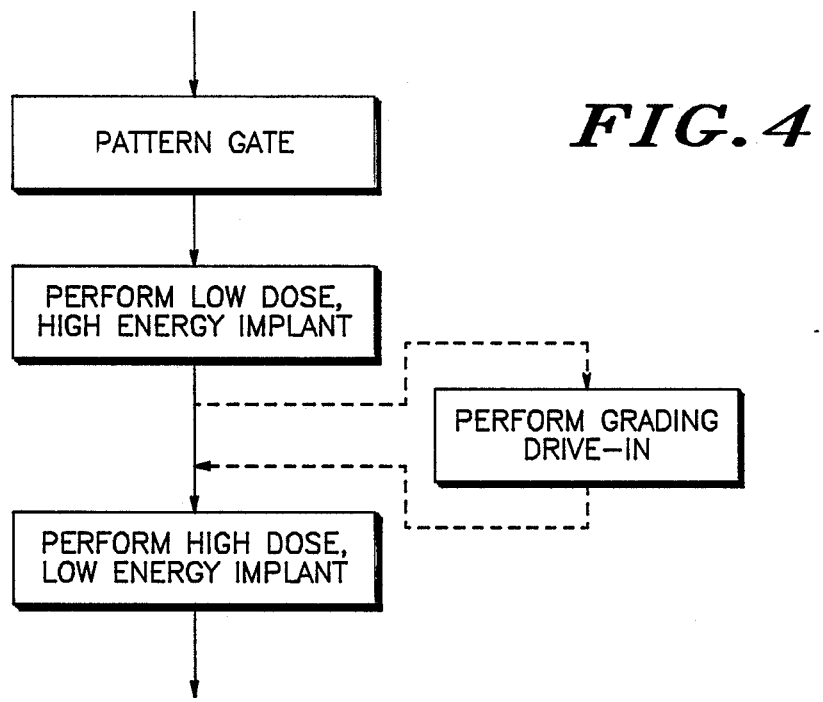
FIG. 4 is a flow chart illustrating the steps of a process according to one aspect of the present invention.
Figure 5:
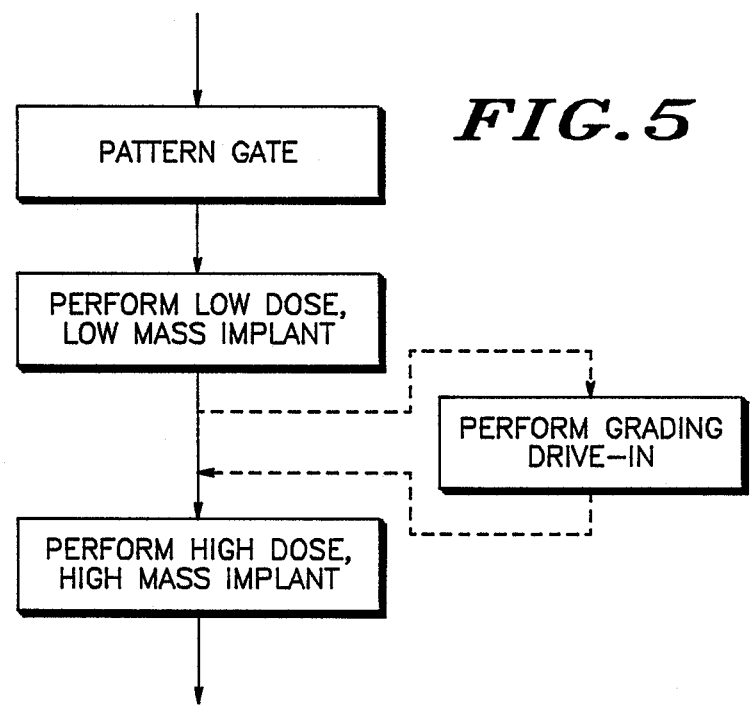
FIG. 5 is a flow chart illustrating the steps of a process according to another aspect of the present invention.

In both FIGS. 4 and 5, the first step related to the formation of the graded junction is the formation of the grading implant region. In the flow illustrated in FIG. 4, this is accomplished with a low dose, high energy implant of some P-type dopant species. In the flow illustrated in FIG. 5, the grading implant is accomplished by means of a low dose, low mass implant. The common feature of the two flows is that the grading implant is performed first and that the parameters of the grading implant (primarily the energy and mass of the implanted species) are chosen to provide the desired implant depth.

In both process flows, the next step is an optional grading implant diffusion step, commonly referred to as a drive-in step. This step involves raising the temperature of the structure to a point at which appreciable diffusion of the implanted dopant will occur. This diffusion is substantially equal in the vertical and lateral directions and is used only if breakdown voltage and junction capacitance concerns dominate over effective gate length concerns in the particular application.

In both process flows, the step following the optional drive-in step is the source/drain implant step. In the process flow of FIG. 4, this is accomplished with a high dose, low energy implant. In the process flow of FIG. 5, this is accomplished with a high dose, high mass implant. The common feature of both methods is a relatively high dose chosen to provide the required low resistivity for the source/drain region and a low energy or high mass chosen to ensure that the depth of the implanted region is less than the depth of the grading region.

In both process flows, normal MOS or other processing follows the double-implant steps described.

The above descriptions will be more clearly understood from examination of the following examples. The baseline device to which each of the examples may be compared is fabricated using a single source/drain implant step using $BF_2$ as the ionic species, an implant energy of 40 KeV and a dose of $5 \times 10^{15}$ per $cm^2$. The N-type well into which this region is implanted has a dopant concentration of approximately $2 \times 10^{16} cm^3$. The breakdown voltage of this junction is approximately 17.0 volts and the junction capacitance is approximately 0.34 femtoFarads per $micron^2$. In each of the following examples, this same source/drain implant is used and the geometry and subsequent processing is not varied.

The first example involves devices which were fabricate with both a grading implant and a drive-in step preceding the source/drain implant. The grading implant is carried out with $BF_2$ as the ionic species, an energy of 180 KeV and a dose of $3 \times 10^{13}$ per $cm^2$. The drivein step is carried out at a temperature of 900 degrees C in an inert (non-oxidizing) atmosphere for a period of 30 minutes. The junction produced has a breakdown voltage of approximately 20.5 volts and a junction capacitance of approximately 0.29 femtoFarads per $micron^2$. These figures represent approximately a 20.5% improvement in breakdown voltage and a 14.7% improvement in junction capacitance over the baseline device. However, at these levels of dose and energy for the $BF_2$ grading implant, dissociation of the implant species may cause penetration of the gate if the implantation is not carefully performed, which will alter the threshold voltage of the device. An alternate method which avoids this phenomenon is discussed below.

The second example involves devices fabricated with both a grading implant and a drive-in preceding the source/drain implant. This time, however, the grading implant uses the much lighter B species instead of $BF_2$. This allows the use of a lower implant energy (40 KeV). The dose is $3 \times 10^{13}$ per $cm^2$. The drive-in step is identical to that disclosed above. The breakdown voltage of the junction is approximately 21.5 volts and the junction capacitance is approximately 0.30 femtoFarads per $micron^2$. These parameters represent improvements of approximately 23.5% and 13.3%, respectively when compared to the baseline device. The devices fabricated according to this example avoided the threshold shift exhibited by the devices described above.

It should be noted that both of the examples noted above include the intervening drive-in step to provide maximum benefit of the grading implant in terms of increased breakdown voltage and decreased junction capacitance. However, if effective gate length problems occur in such a device, the drive-in step may be curtailed or eliminated, with some trade-off in the expected grading benefits.

The method disclosed above offers several advantages over the prior art double-implant graded junction processes. The fact that the grading implant is performed first allows the option of a thermal (drive-in) step which will redistribute the grading dopant but which will not be experienced by the source/drain dopant. With the use of ion energy and/or mass to provide control over vertical grading and the optional diffusion step providing control over lateral grading, the process of the present invention offers separate control over several important device parameters. Junction capacitance and breakdown voltage may both be improved over non-graded junctions while minimizing the effects of lateral diffusion on effective gate length.

While the present invention has been described with reference to a several particular embodiments thereof, it is understood that numerous modifications to the particulars thereof are within the spirit and scope of the present invention.

We claim:

1. A method of forming a graded P-type source/drain semiconductor region within an N-type semiconductor region comprising the steps of:

performing a first ion implantation step at a relatively lower dose and using one of a relatively higher energy and a relatively less massive ion, said first ion implantation step introduces a P-type dopant into said N-type semiconductor region; and performing a second ion implantation step, without performing any intervening patterning steps between said first and second ion implantation steps, at a relatively higher dose and using one of a relatively lower energy and a relatively more massive ion, said second ion implantation step introduces a P-type dopant into said N-type semiconductor region.

2. A method according to claim 1 further comprising the step of:

performing a grading drive-in step subsequent to said first ion implantation step and prior to said second ion implantation step.

3. A method of forming a graded P-type source/drain semiconductor region within an N-type semiconductor region comprising the steps of:

performing a first ion implantation step at a relatively lower dose and using one of a relatively higher energy and a relatively less massive ion, said first ion implantation step introduces a P-type dopant into said N-type semiconductor region;

optionally performing a grading drive-in step subsequent to said first ion implantation step and prior to a second ion implantation step; and performing a second ion implantation step, without performing any intervening patterning steps between said first and second ion implantation steps, at a relatively higher dose and using one of a relatively lower energy and a relatively more massive ion, said second ion implantation step introduces a P-type dopant into said N-type semiconductor region.

* * * * *